United States Patent [19]

Bohrn et al.

[11] Patent Number: 4,851,021
[45] Date of Patent: Jul. 25, 1989

[54] MULTI-PLY COMPOSITES AND SHEETS OF EPOXY AND FLOCCED 2:1 LAYERED SILICATES AND METHODS FOR THEM

[75] Inventors: Walter J. Bohrn; Shelly N. Garman; Thomas M. Tymon, all of Lancaster, Pa.

[73] Assignee: Armstrong World Industries, Inc., Lancaster, Pa.

[21] Appl. No.: 143,945

[22] Filed: Jan. 14, 1988

Related U.S. Application Data

[63] Continuation-in-part of Ser. No. 15,756, Feb. 17, 1987, which is a continuation-in-part of Ser. No. 715,973, Mar. 25, 1985, abandoned.

[51] Int. Cl.$^4$ .................. C04B 20/02; C04B 20/06
[52] U.S. Cl. ............................ 65/17; 65/33; 65/901; 65/60.3; 501/151; 264/110; 156/330; 156/62.2; 106/DIG. 3
[58] Field of Search .................. 65/17, 60.3, 18.1, 901, 65/30.1, 30.13, 33; 162/3, 9; 501/12, 36, 151, 153, 154, 95; 106/D3; 264/110, 204; 428/446; 524/449; 156/62.8, 62.2, 330, 307.1, 307.5

[56] References Cited

U.S. PATENT DOCUMENTS

| | | | |
|---|---|---|---|
| 2,481,391 | 9/1949 | Campbell | 106/75 |
| 3,001,571 | 9/1961 | Hatch | 154/2.6 |
| 3,325,340 | 6/1967 | Walker et al. | 161/168 |
| 3,356,611 | 12/1967 | Walker et al. | 252/28 |
| 3,654,073 | 4/1972 | Lard et al. | |
| 3,764,456 | 10/1973 | Woodhams | 161/171 |
| 3,779,860 | 12/1973 | Oshida et al. | 162/129 |
| 3,824,297 | 7/1974 | Osaka | 264/25 |
| 3,830,892 | 8/1974 | Saita | 264/25 |
| 3,970,627 | 7/1976 | Seymus | 260/29.6 F |
| 4,060,451 | 11/1977 | Uchiyama et al. | 162/157 R |
| 4,123,401 | 10/1978 | Berghmans et al. | 260/29.6 F |
| 4,239,519 | 12/1980 | Beall et al. | 65/30.13 |
| 4,297,139 | 10/1981 | Beall et al. | 501/2 |
| 4,305,992 | 12/1981 | Langer et al. | 428/324 |
| 4,325,858 | 4/1982 | Saito et al. | 524/524 |
| 4,366,204 | 12/1982 | Briggs | 428/331 |
| 4,421,175 | 12/1983 | Boyadjieff et al. | 166/383 |
| 4,447,491 | 5/1984 | Bradbury et al. | 428/304.4 |
| 4,454,237 | 6/1984 | Hoda et al. | 501/2 |
| 4,480,060 | 10/1984 | Hoda et al. | 523/466 |
| 4,485,203 | 11/1984 | Hutchinson | 524/414 |
| 4,491,618 | 1/1985 | Kuwajiima et al. | 428/241 |
| 4,559,264 | 12/1985 | Hoda et al. | 428/324 |
| 4,675,235 | 6/1987 | Wu | 428/363 |
| 4,707,298 | 11/1987 | Tymon | 502/151 |

FOREIGN PATENT DOCUMENTS 8002770 8/1981 France.
0615541 1/1949 United Kingdom.
1119305 7/1968 United Kingdom.

OTHER PUBLICATIONS

Lepoutre et al, "Dry Sintering of Latex . . . Coating Structure and Properties", Jour. of App. Poly. Sci., vol. 26, pp. 791–798, 1981.

Primary Examiner—David L. Lacey
Assistant Examiner—L. Johnson

[57] ABSTRACT

Sheets and laminated composites are described which are prepared with epoxy and flocculated vermiculite and mica dispersions. Processes and procedures are also described to obtain film and sheet materials from the flocculated silicate and epoxy dispersions.

22 Claims, No Drawings

MULTI-PLY COMPOSITES AND SHEETS OF EPOXY AND FLOCCED 2:1 LAYERED SILICATES AND METHODS FOR THEM

This is a continuation-in-part application of U.S. Patent application No. 15,756, which, in turn is a continuation-in-part of U.S. application No. 715,973, now abandoned.

BACKGROUND OF THE INVENTION

It is known that non-asbestos papers and/or sheets may be produced from water-swellable inorganic materials and, in particular, swelled silicate gels. For example, U.S. Pat. No. 4,239,519 is directed to the preparation of synthetically derived, inorganic, crystal-containing gellable, water-swelling sheet silicates and certain articles, such as papers, fibers, films, boards, and laminated, produced therefrom. These non-asbestos papers and/or sheets exhibit good high temperature stability and good chemical resistance. Furthermore, since asbestos fibers are not utilized in their manufacture, such articles will not have the health hazards which are associated with asbestos containing articles.

U.S. Pat. No. 4,239,519 teaches the method for making the precursor gellable silicates used to produced said papers or sheet articles, as involving three fundamental steps: (a) a fully or predominantly crystalline body is formed which contains crystals consisting essentially of a lithium and/or sodium water-swelling mica selected from the group of fluorhectorite, hydroxyl hectorite, boron fluorphlogopite, hydroxyl boron phlogopite, and solid solutions between those and other structurally compatible species selected from the group of talc, fluortalc, polylithionite, fluorpolylithionite, phlogopite, and fluorphlogopite; (b) that body is contacted with a polar liquid, normally water, to cause swelling and disintegration of the body accompanied with the formation of a gel; and (c) the solid: liquid ratio of the gel is adjusted to a desired value depending upon the application therefore. Glass-ceramics are the preferred crystalline starting bodies. Those products are then contacted with a source of large cations, i.e., with an ionic radius larger than that of the lithium cation, to cause macro flocculation of the gel and an ion exchange reaction to take place between the large cations and the $Li^+$ and/or $Na^+$ ions from the interlayer of the crystals.

Alternatively, U.S. Pat. Nos. 3,325,340 and 3,454,917 teach producing aqueous dispersions of vermiculite flaked crystals which have been caused to swell due to the introduction therein of interstitial ions such as: (1) alkylammonium cations having between 3 and 6 carbon atoms inclusive in each carbon group such as methylbutylammonium, n-butylammonium, propylammonium and iso-amylammonium; (2) the cationic form of aminoacids, such as lysine and ornithine; and/or (3) lithium.

While the articles, such as papers, sheets and films, prepared via the prior art processes set forth above exhibit excellent heat resistance and are useful in a wide variety of applications, it has been discovered that such articles generally do not exhibit good sealing characteristics, thus curtailing their use as gasket materials. The prior art articles also exhibit a certain amount of water sensitivity which is generally exhibited by the articles having a considerable loss of strength and general deterioration of mechanical and electrical properties when exposed to high humidity environments or submerged in water or other polar liquids. This sensitivity to water correspondingly limits the utility of these articles in certain applications, such as, for example, head gaskets, electrical insulators, environmental protective coatings, and washable and environmentally stable building materials.

SUMMARY OF THE INVENTION

Several embodiments are described herein including compositions which combine flocculated silicates and epoxy.

The embodiments of the instant invention which combine 2:1 layered silicates and epoxy include: (1) a flocculated co-dispersion of the epoxy and silicate in form of a sheet or film, (2) a flocculated silicate film having an epoxy coating; (3) a flocculated co-dispersion of epoxy and silicate in the form of a film, the film having an epoxy coating. Embodiments (1), (2) and (3) above, further include the use of an epoxy cure accelerator and/or an epoxy curing agent, both of which can be used: (a) only as a topical application or (b) as an internal additive (mixed into the epoxy-silicate dispersion or floc), or (c) both as internal and external additives (combining (a) and (b).

One embodiment describes a method by which an aqueous dispersion of 2:1 layered silicate mineral material is flocculated using specifically described cations. Surprisingly, it has been discovered that certain cations derived from diamines, triamines, and tetraamines will flocculate 2:1 layered silicate instead of maintaining, allowing, or causing the silicate to disperse. Advantageously, in the instant process, cations derived from diamines, triamines, and tetramines can be used to conduct an ion exchange reaction with an aqueous dispersion of 2:1 layered silicate material having an average charge per structural unit of from about $-0.4$ to about $-1.0$. This ion exchange reaction will produce a flocculated silicate. The flocculated 2:1 layered silicate material has a semi-solid, soft consistancy even in large amounts of water. It should be emphasized that it is amine functionality which has the ability to flocculate these silicates. The inclusion of other moieties which are acidic such as lysine and ornithine will interfer with flocculation. Such groups should therefore be avoided.

A method of preparing a flocced mineral material that can be utilized to form a non-asbestos high temperature article that exhibits water resistance comprises (1) contacting a swelled 2:1 layered silicate having an average charge per structural unit that ranges from about $-0.4$ to about $-1$ and which contains exchangeable interstitial ions with at least one species of an exchange cation taken from compounds consisting essentially of diammonium compounds; thereby, (2) conducting an ion exchange reaction between at least some of the exchangeable interstitial ions, and at least some of the exchange cations; further providing, however, that the 2:1 layered silicate was swelled by contacting the 2:1 layered silicate with a polar liquid for a sufficient time to cause swelling of the layers and gel formation. The phrase "consisting essentially of" as used above excludes moieties such as the COOH of ornithine, which interferes with flocculation. The diammonium exchange cation thus mainly includes two amine moieties and one or more hydrocarbon moieties.

It is important to realize that the flocced silicate product of the instant process is very distinct from the silicate dispersion even when compared to the high solids content dispersions which are semisolid gels. The flocculated layered silicate material produced by the instant process will not readily redisperse in water as will the layered silicate gels containing other interstitial cations such as ornithine or n-butylammonium, n-propylammonium, and lithium.

Since the silicate floc of the instant invention remains agglomerated, not readily re-dispersing, the product of the instant ion-exchange reaction can be washed, preferably with water. This is a significant feature since similar interstitial cation exchanged-silicate combinations give silicate products that do not retain its agglomerated state, and instead, wash away or is redispersed in water.

A significant feature of the instant silicate-interstitial cation combination, therefore, is its superior water resistance. In addition to this, the floc produced by the instant method is more easily collected and handled than the prior art counterparts.

High temperature, fire-resistant, nonasbestos, water-resistant articles, such as a sheet, paper, board, film, fiber and laminated articles, can be made using the instant silicate material that is prepared by utilizing an exchange cation that is derived from diamine compounds. Such articles, surprisingly, have been found to exhibit, in general, superior mechanical properties as can be noted in the tensile strength and puncture resistance data given in the experimental section.

The diamines are therefore superior silicate flocculants, enabling one to obtain stronger and more water-resistant flocs than other flocculants. Even more remarkably, it has been discovered that certain groups of diamines can be used to optimize electrical properties, and others to optimize mechanical flexibility (see elongation tests).

With reference to heat resistance, the articles that are produced according to the present invention are completely stable to temperature of approximately 350–400° C. and maintain their structural stability to approximately 800° C.

Other embodiments include (1) the flocced 2:1 layered silicate gel material, having an average charge per structural unit of from about −0.4 to about −1.0 having ion exchanged interstitial cations taken from compounds consisting of: diammonium compounds (+2 diamine cations); (2) the flocculated silicate of #(1) including an organic oligomer (added before or after flocculation); preferably epoxy; (3) a process for the flocced diammonium exchanged-silicate and epoxy composition of #(2); and (4) the compositions of both numbers (1) and (2) including fibrous or fibrous pulp materials; preferably polybenzimidazole.

The epoxy flocculated silicate materials can also be prepared with cations having the N—C—N moiety, which are also described herein.

Still other embodiments include articles and films made from the above described flocced mineral gel.

DETAILED DESCRIPTION OF THE INVENTION

The articles and the flocced mineral dispersions of the present invention are, in one embodiment of the invention, prepared by utilizing, as a starting material, a dispersable sheet (2:1 layered) silicate that has an average charge per structural unit of from about −0.4 to about −1 and which contains interstitial exchangeable cations that promote swelling. The specific exchange cations in the starting material will depend on the silicate being utilized. For example, if a synthetically derived gellable silicate, which is for example, made according to the procedures of U.S. Pat. No. 4,239,519, is utilized as a starting material, the exchange cations will generally be $Li^+$ and/or $Na^+$ ions. If a natural vermiculite dispersion (such as made according to U.S. Pat. No. 3,325,340) is utilized, the exchange cations will generally include alkylammonium cations or other cations mentioned in the reference. The silicate, whether synthetic or natural in origin, will most often have morphologies that are represented by thin flakes which are generally disc, strip, and/or ribbons. Although there is no intention or practical need to be limited to any specific measurements for the flakes, they will typically have measurements which are from about 500 A (Angstroms) to 100,000 A, and preferably 5,000 A to 100,000 A in length, 500 A to 100,000 A in width, and less than 100 A thick.

The silicates which can be used to prepare the instant composition and articles includes both micas and vermiculites. The silicates which can be used in the process of the present invention can all be referred to as 2:1 layered silicates and can be found defined and described in: *Crystal Structures of Clay Materials and Their X-Ray Identification* by G. W. Brindley and G. Brown, published by Mineralogical Society, 1980, especially pages 2–10. The term "mica" is used herein to refer to layered silicates having a charge density approximately equal to −1, while vermiculites have a charge density in the range of about −0.5 or −0.6 to −0.9. Examples of specific layered silicates which may be used in the invention are vermiculite, muscovite, phlogopite, biotite, fluorphlogopite, lepidolite and lepidomelane. A preferred mica can be selected from the group of fluorhectorite, hydroxyl hectorite, boron fluorphlogopite, hydroxyl boron phlogopite, and solid solutions among those and between those and other structurally compatible species selected from the group of talc, fluortalc, polylithionite, fluorpolylithionite, phlogopite and fluorphlogopite.

The term "vermiculite" is used herein to refer to the group of rock-forming mineral species characterized by a layer lattice structure in which the silicate layer units have a thickness of approximately 10 A (1.0 nm), the main elements present in the layers being magnesium, iron, aluminum, silicon and oxygen, the layers being separated by one or two sheets of water molecules associated with cations such, for example, as magnesium, calcium, sodium and hydrogen and the layers being of considerable lateral extent relative to the thickness of the basic 1.0 nm unit layer. The term "vermiculite" as used herein accordingly includes minerals consisting wholly or largely of vermiculite, or minerals of a mixed-layer type containing vermiculite layers as an important constituent, such as hydrobiotites and chlorite-vermiculites.

The term "charge per structural unit" as used in the specification and claims refers to an average charge density as specified by G. Lagaly and A. Weiss, "Determination of Layer Charge in Mica—Type Layer Silicates," Proceedings of International Clay Conference, 61–80 (1969) and G. Lagaly, "Characterization of Clays by Organic Compounds," Clay Minerals, 16, 1–21 (1981).

One term used herein which refers to the starting silicate materials is "swelled layered silicate". Such silicate material refers to the 2:1 layered silicates which have been subjected to ion-exchange reactions so that they will swell and disperse generally in aqueous solutions. This term, therefore, refers to silicate dispersions or silicate gels, formed by removing water from such silicate dispersions, and dried silicate materials which can be contacted with water to form a silicate gel or dispersion.

The term "silicate dispersion" as used herein refers to the suspension of 2:1 layered silicate in a polar solution (usually water). The term "dispersion" is applied furthermore to both low solids content dispersions (about 1 to about 5% solids) which flow and have liquid properties and to the high solids content dispersions which are usually thought of as gels.

When the silicate dispersion is flocculated, the silicate agglomerates into the floc which typically drops out of the solution if the dispersion has a low solids content. The flocculation of a low solids content dispersion thus causes a more readily noticeable destablization of the dispersion. When a high solids content dispersion or gel is flocculated by contacting the gel with the flocculant, the destablization and floc formation still take place although the change might not be visually notable without close examination. When preferred flocculated are selected, it has been found that the floc formed can be extremely distinctive in physical and electrical properties even compared to a silicate gel. For example, remarkably, the diammonium cations enable a silicate floc to be handled and washed whereas the high solids content dispersion (gel) would have washed away.

It should be emphasized that the starting 2:1 layered silicate must be a swelled layered silicate. When a natural mica is used, it is especially important to prepare the silicate so that the interstitial ion is exchangeable with the instant cations. Thus, potassium depletion must ordinarily be carried out before preparing the swelled layer silicate or silicate dispersion which is the starting material of the instant invention. This potassium depletion can be carried out using ion exchange techniques.

The starting silicate can be made according to the afore-mentioned procedures of U.S. Pat. Nos. 4,239,519; 3,325,340; or 3,434,917 or other methods for the preparation of dissociated layer materials (silicate dispersions and gels) with charge densities in the desired ranges. These aqueous silicate dispersions have also been referred to as silicate suspensions. A preferred starting material is a silicate dispersion (a swelled layer silicate) having interstitial cations selected from the group consisting of: lithium, sodium, n-butylammonium, diethylammonium, n-propylammonium.

It is noteworthy that while most silicate dispersions are prepared using water, it has been found that polar solvents can be used for the dispersion. Thus, the dispersion can also be prepared by using a selected polar solvent or mixture thereof. The polar solution can also include some non-polar hydrocarbon (less than 10% by weight). The processes and products of the instant invention can thus use polar solutions to prepare the dispersions and flocs. The cationic flocculant which is used for the ion exchange thus preparing the floc can desirably be placed in a polar solvent for the exchange.

The polar solution used in the instant process can be selected from ketones, glycols, alcohols, and water. The alcohols and ketones preferably have from 1 to 6 carbon atoms. Preferably, the solvent is a polar protic solvent mixture preferably selected from the group of water, methanol, ethanol, propanol, isopropanol, butanol and glycol. A preferred combination is methanol and water. Acceptably, the polar protic solvent mixture can be a minimum of 40% by weight water; and preferably, it is a minimum of 75% by weight water. These polar protic solvent mixtures are particularly useful for solvating the amino functional cationic flocculants described herein. The most preferred liquid system for both the silicate dispersion and the exchange with the cationic flocculants, however, is substantially aqueous.

The dispersed silicate is then contacted with a source of at least one species of the cations described herein thereby causing an ion exchange reaction between the instant cations and the interstitial ions. This ion exchange reaction, carried out between the cations and the silicate material thereby forms a floc which can then be utilized to form specific articles. In another embodiment of this invention, the starting silicate can be directly formed into a product, such as a fiber (for example, lithium fluorhectorite fiber) a film by using the procedures of U.S. Pat. No. 4,239,519, a molded article from the swelled-layer silicate gel (high solids content dispersion). After this, a cationic exchange reaction utilizing the instant cations can be carried out with the product, such as by immersing the product into a solution of multiamine derived cations. The ion exchange reaction may also be carried out in situ while preparing the dispersion to be flocculated.

In another preferred embodiment, the silicate dispersion is adjusted to a desired percent solids content by the addition of a specific amount of polar solvent or by the removal of solvent from the dispersion. The silicate dispersion, having the desired percent solids level, is then in a sufficiently viscous or semi-solid state to be made into a film, molded into an article, or applied to non-woven or woven fibrous materials. The resulting composition can then be contacted with the selected diammonium flocculating cation for flocculation.

Preferably, the exchange reaction is conducted for a minimum effective time period. While there is no maximum length of time for this exchange, it is desirable to complete the first step in as short a time period as possible. The ion exchange of the first step can be conducted over a period of time from 5 seconds to 10 hours and, most preferably, from 1 to 5 minutes.

The instant exchange cation should also be provided in a sufficient amount to be effective in conducting this ion exchange (flocculation) of the swelled layered silicate. While a wide range of molar ratios of exchange cation to the silicate is appropriate, the flocculating cation is used at a minimum effective concentration to cause flocculation. It has been found that solutions as low as 0.01M in diammonium compounds will flocculate the silicate. A most suitable concentration range for the solution of the instant cations can be from about 0.01 to about 3 molar, the proportion of solution to silicate being at a level convenient for further processing, at minimum one gram of solution per gram of silicate.

The term "multiamine derived cations", when used in reference to the exchange cations that may be utilized in the present invention, refers to low molecular weight, non-polymeric, di, tri, and/or tetramino functional compounds, wherein the amine moieties have been formed into cations, such as by being protonated, to thereby be positively charged. The term "derived" thus refers to the change from the neutral diamine to the diammonium cations. The diamines are the preferred multiamine compounds.

One preferred group of diammonium cations have the formula:

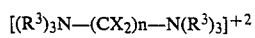

wherein (1) each $R^3$ is independently selected from hydrogen, a $C_1$-$C_8$ straight or branched chain alkyl group, or an aryl group, with the proviso that there be no more than one aryl group on each nitrogen, (2) each X is independently selected from hydrogen, an alkyl group or an aryl group and (3) n represents an integer from 2 to 15, with the option that, when n is 3 or more, the $CX_2$ groups may form ringed moieties which may be aromatic.

A similar preferred group of cationic diamines are compounds having the formula:

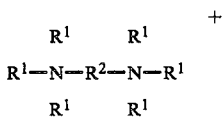

wherein each $R^1$ can independently be either hydrogen or a $C_1$-$C_8$, (saturated or unsaturated) straight or branched chain alkyl group; preferably, each $R^1$ hydrogen or is a $C_1$-$C_4$ straight or branched chain alkyl group. Most preferably, R1 is a moiety selected from hydrogen, methyl and ethyl. $R^2$ is a saturated, or unsaturated linear or branched hydrocarbon moiety. Preferably, $R^2$ is an alkyl group. Suitably, $R^2$ can have from 1-18 carbon atoms. For some of these flocculants, for example, where one or more $R^1$ has from 1 to 8 carbon atoms and where $R^2$ has from 10 to 18 carbon atoms, it is desirable to use a polar solvent mixture which is polar protic.

Within this specific group of preferred cationic diamine flocculants, it has been discovered that some selection of the specific diamine flocculant can be made based upon the desired characteristics of the end floc. In other words, this specific group of diamines will yield a floc which is not only superior in wet strength and water resistance, but also demonstrates physical characteristics optimized in certain other categories which are dependent upon the carbon chain length range selected for $R^2$.

Thus, in order to obtain a final product having good flexibility, then the diamine used should correspond to the diamines having the formula indicated above which each $R^1$ is hydrogen, and $R^2$ has from 1 to 6 carbon atoms, and is preferably, a saturated, branched or linear alkyl moiety. Specific diammonium cations derived from diamine compounds which can be used to obtain added flexibility can be selected from the group consisting of: ethylene diammonium, 1,2-propanediammonium, 1,4-butanediammonium, 1,3-propanediammonium, 1,5-pentanediammonium and diammonium methane.

A second group of diamines capable of giving outstanding strength and water resistance especially wet and dry puncture resistance and tensile strength correspond to the formula indicated above where $R^1$ is hydrogen, and R2 has from 6 to 18 carbon atoms. Preferably, $R^2$ moreover is a linear or branched alkyl group. In this category, preferred compounds can be selected from the group consisting of: 1,6-hexanediammonium, 1,7-heptanediammonium, 1,8-octanediammonium, 1,9-nonanediammonium, 1,10-dodecanediammonium, 1,11-undecanediammonium, and 1,12-dodecanediammonium.

Another category of the diamines which is even more important for the preparation of composites, films, laminates, and other articles which must have good dielectric properties are the compounds corresponding to the above formula where $R^1$ is hydrogen and $R^2$ has 8 to 18 carbon atoms. In the most preferred of these, $R^2$ is an alkyl group. The most preferred compounds in this category can be selected from the group consisting of: 1,8-octanediammonium, 1,9-nonanediammonium, 1,10-dodecanediammonium, 1,11-undecanediammonium, and 1,12-dodecanediammonium.

The flocced silicates of the present invention can be prepared, by reacting a suitable silicate dispersion with a source of exchange cations derived from the previously specified di, tri, and tetramine compounds in order to effect an ion exchange between the multiamine derived cations and the interstitial cations in the silicate gel to form ion exchanged flocculated particles. If desired, agitation is used.

One or more different species of the instant cations can be utilized in the cationic exchange reaction. Since the various cations will give a floc, and eventually articles having certain physical characteristics, optimized, the specific cation or combination of cations will be chosen by the practitioner of this invention based on the desired end use.

The terms "multiamine derived cations" or "cationic derivative" or the like is used in the specification and claims to indicate that the center for cationic activity is centered on the nitrogen groups in the multiamines. This can be accomplished by protonating the multiamines or using the quarternary ammonium salt to obtain a positive charge. This takes place before the cationic exchange can be made with the swelled silicate gel.

While it is preferred to prepare desired articles by forming the article from a higher solids content dispersion, it is also possible to prepare the articles from the flocced material. The specific treatment steps applied to the floc will depend on the particular article being formed. For example, if the articles of the present invention are to be formed into sheet materials in a preferred embodiment, the resultant exchange floc will be agitated with sufficient shear effective to produce a particle size distribution which leads to suitable particle packing in the sheet forming operation. Improved packing will result from a reduced particle size. Following this process, the floc an optionally be washed to remove any excess salt solution and the consistency of the flocced slurry is adjusted to from about 0.75% to about 2% solids.

The above described slurry can be fed to a papermaking apparatus where it is dewatered by free drainage and/or vacuum drainage followed by pressing and drying on drum driers. The sheet material formed can, in turn, be used in applications such as gaskets and the like, if desired.

If desired, and depending on the intended end use of the articles, additional inert materials can also be added to the flocced mineral suspension. For example, if desired, one or more fibrous materials from the group of natural or synthetic organic fibers or inorganic fibers may be added to the floc to improve its drainage rate and to provide an end product that has improved strength and/or handleability. For example, when the desired end products are gaskets, the fibers of choice are cellulose fibers, glass fibers, and/or Kevlar fibers (Kevlar is a trademark of DuPont Corporation for an aromatic polyamide fiber). In another preferred embodiment, fibrous material is incorporated in the first step of the process to prepare a homogeneous dispersion of silicate and fiber. This mixture is the flocculated. Both organic or inorganic fibers can be used. Polybenzimidazole fibers are preferred. The fibers can be combined with either the dispersion or the floc in amount of from about 5 to about 50% by weight of the total solids. If desired, the dispersion can be applied to a woven or non-woven fibrous substrate, followed by flocculation.

Preferably, the cationic exchange reaction is be conducted directly on a product formed from the silicate starting material. In this case, any desired additional inert materials would be added to the dispersion containing the silicate starting material prior to the formation of the article and, of course, the subsequent cationic exchange reaction.

It has been discovered that epoxy resins can be particularly desired in the instant compositions. The use of epoxy oligomers adds strength to the final product and, when used in conjunction with diamine-exchanged floc, seem to promote a dual functionality in the diamines, which act not only as exchange cations for the sheet silicate material but also aid in curing the epoxy. The resultant product has enhanced strength, chemical resistance and dielectric properties.

If desired, an organic oligomer such as a selected epoxy resin can be homogeneously combined with 2:1 layered silicate material followed by flocculation; alternatively, the organic oligomer can also be added after flocculation.

The dispersable or swellable 2:1 layered silicate material can be combined with a specific amount of polar liquid to obtain a desired percent solids level, or solvent can be removed from the prepared dispersion to obtain the percent solids level desired. Thereafter, a combination of oligomer and silicate can be made having a specific viscosity. Flocculation can then either be conducted in a bath such as by combining the homogeneously dispersed mixture with a solution containing the flocculant, although an article or film can be made from the non-flocculated homogeneously dispersed mixture of silicate and oligomer. The article shaped from the dispersion of the 2:1 layered silicate and organic oligomer can then be contacted with the flocculant for ion exchange to take place thereby flocculating the silicate.

An organic oligomer is understood to be a compound having from 3 to 15 repeating units. The molecular weight of such materials is generally in the range of from 350 to 10,000. Although higher molecular weight oligomers are known, epoxies are the preferred olligomer and generally have from 5 to 15 repeating units per molecule and a molecular weight in the range of 1,500 to 3,000. When epoxies are combined with the instant silicate materials before flocculation, curing agents can also be combined before flocculation. After flocculation, the epoxy which is contained within the floc can then be cured when desired by subjecting the floc to heat. Generally, at a temperature in the range of from about 120° to about 220° C.

Films can be prepared from any of the 2:1 silicate dispersions previously described, including epoxy-containing dispersions. The film can be drawn down using film-forming apparatus and flocculation can then be conducted by contacting the film with the flocculant. While any cationic flocculant can be used, the diammonium cations described herein are preferred due to the superior characteristics which they provide. Other acceptable cations that can be used are metal cations of the $+2$ and $+3$ valency. These are unusually provided by a soluble salt. The best films are prepared from high charge density silicates. The instant flocculated silicate material selected from mica and vermiculite (the material having a charge density of from about $-0.5$ to about $-1.0$ and preferably from about $-0.6$ to about $-1.0$) is superior in strength and handling properties; particularly desired for articles such as films. It has also been found that epoxy can be applied to the wet and dry silicate films after flocculation to form epoxy coated sheets. In such a case, any desired curing agent or accelerator and the epoxy can be topically applied, followed by curing.

It has been found that films containing epoxy can be made semitransparent by drying the films at an elevated temperature. Thus, a semitransparent film of epoxy trapped within the flocculated 2:1 layered silicate material can be prepared by drying a previously prepared and flocculated film at elevated temperatures. To avoid formation of bubbles in the film, the temperature should be less than the boiling point of water. Suitably, the temperature is from about 45° to about 95° C.

The flocculated 2:1 layered silicate and epoxy compositions acceptable have from about 1 to about 75% by weight epoxy on a dry weight basis with the silicate ranging from about 99% to about 25% by weight. A preferred epoxy concentration range is from about 10 to about 60% by weight.

In preparing such materials, a homogeneous dispersion of 5% total solids or greater of the epoxy and delaminated 2:1 layered silicate materials can be prepared. The solids having from about 1 to about 75% by weight epoxy for the floc. For dispersions having a total solids content of less than 5%, the epoxy concentration in the dispersion solids preferably, is from about 2 to about 79% by weight.

Cationic flocculants derived from the diamine compounds indicated above are extremely preferred for combination with epoxy because of the superior strength and electrical properties which can be obtained from the materials produced.

Although it is possible to use other cationic flocculants, such as aluminum, barium, etc. to flocculate the instant homogeneous dispersions of 2:1 layered silicate materials and epoxy, such flocculating cations will produce a material having less preferred qualities of water resistance, tensile strength, elasticity and electrical properties, etc. Diammonium flocculating cations derived from the diamine cations described previously therefor are the most preferred flocculants. Other flocculating cations which are preferred are cations having the moiety (—NCN—), derived from compounds having the formula: [R4C(R5)R6] wherein R4, R5 and R6 are independently selected from $NH_2$ and $CH_3$; provided, however, that at least two or more of R4, R5, and R6 are $NH_2$ but further providing that one or more of the hydrogen atoms of R4, R5 and R6 may instead be a substituent selected from: a $C_1$ to $C_5$ alkyl, a $C_2$ to $C_5$ alkenyl, and a $C_2$ to $C_5$ alkynyl wherein these substituents may be linked to form one or more rings which may be saturated, unsaturated or aromatic. Preferred cationic flocculants in this group can be selected from guanidinium, aminoguanidinium, diaminoguanidinium, methalguanidinium, tetramethalguanidinium, melaminium, 2-aminopyredinium, and 2,-diaminopyridinium. When using the diammonium cations flocculation can be carried out using an aqueous solution which is as low as 0.01 molar in the flocculating cation. Preferably, the concentration range is from about 0.1 molar to 5 molar. The flocculating cations act upon the silicate agglomerating the layers of silicate and arranging or holding them together into the floc. While not wishing to be bound by theory, it is felt that when flocculation of the silicate layers takes place, flocculation tends to entrap the other material fixing it more solidly within the floc. The article will then be more resilient and stronger than it would be if the material was added subsequent to flocculation. In this case, it is preferred to combine the silicate dispersion with such materials such as fibers or epoxies before flocculation.

If epoxy is used in the instant silicate materials, a curing agent should be present when epoxy curing is desired. While the curing agent can be added at any point in the process, and even topically applied. In one preferred embodiment it is added to the dispersion with the epoxy.

Curing can be done when desired by subjecting the material to an effective amount of heat for an effective time. In preferred embodiments, a cure accelerator is used. Preferably, the flocced material is dried before curing. If desired, vacuum can be used to accelerate drying. Optionally, the material can be subjected to simultaneous drying and curing, in which case the temperature should be over 120° C.

Drying temperatures, used with or without a vacuum preferably are in the range of from about 25° C. to about 90° C. At these temperature, however, the epoxy does not cure. Acceptably, the curing temperature is in the range of from about 120° to 220° C.

The cure accelerator can be added either to the dispersion with or without the addition of a curing agent. Alternatively, the accelerator could also be added during or after flocculation. Thus, it can generally be added at any point in the process before curing. Preferably, however, it is topically applied to the material to be cured just before epoxy curing. When using elevated temperatures to dry the epoxy-silicate floc, before the epoxy curing is desired, it is preferred to topically apply the curing agent (with or without a cure accelerator) after the floc-product drying step. This can especially be taken advantage of when laminates and sheet materials are prepared. The curing agent can be topically applied, for example, by spraying, painting or immersing.

Preferably epoxy oligomers which can be used are: solid bisphenol A epoxy, urethane modified bisphenol A epoxy, polyfunctional aromatic epoxy, and elastomer modified bisphenol A epoxy. The equivalent weight of the epoxy can acceptably range from 100 to 750.

A film (or sheet) can be formed by any process, step or procedure which will provide a layer of material which is thinner than its length and breadth. In addition to such sheet materials, the desired flocced silicate epoxy material can also be made into any other shape or article; for example, a brick, tile, board or fiber.

The term "water resistant" as used in the specification and claims is not meant to imply that the articles of the present invention are waterproof or are completely impervious to water. The terms is used to indicate that the materials do not substantially degrade, at least in their tensile strength, elongation and puncture resistant properties, when exposed to water.

In addition to being water resistant and having excellent fire and heat resistant, it has been discovered that the articles of the present invention possess excellent electrical properties and are thereby suitable for a variety of applications, including electrical insulators, cable wrap and, in particular printed wiring boards.

In these following Examples, unless otherwise specified, the starting material utilized was a lithium fluorhectorite made according to procedures taught in U.S. Pat. No. 4,239,519. All parts and percentages are by weight unless otherwise indicated. These samples are offered to illustrate the instant invention and should not be taken to limit it.

EXAMPLE 1

This example illustrates a method of producing both a diamine exchanged fluorhectorite flocced silicate and a formed sheet that was prepared therefrom.

A slurry of 1,6 hexanediammonium fluorhectorite (made from the corresponding diamine) was prepared by adding 200 grams of a 10% dispersion of lithium fluorhectorite to 2 liters of 1N 1,6 hexanediamine dihydrochloride solution. The slurry was then agitated with a high shear mixer to reduce the particle size of the resultant floc, was washed and the was analyzed for water content and diluted to result in a 2% solids slurry. The slurry was transferred to a 11.5"×11.5" hand sheet mold (manufactured by Williams Apparatus Co.) and dewatered. The resultant formed sheet was then wet pressed and dried on a drum drier. The sheet had good flexibility and performed well in the gasket sealing test.

EXAMPLE 2

Using the procedures of previous Example 1, a handsheet was prepared from the following slurry:

|  | Wt. Percent |
|---|---|
| 1,6-hexanediammonium fluorhectorite | 58.7 |
| NBR latex | 3.2 |
| Alum | 2.9 |
| Micro Talc | 5.9 |
| Redwood Fiber | 2.9 |
| Kevlar © Fiber | 2.9 |
| Mineral Wool | 23.5 |
| Total | 100.0 |

The resulting handsheet was subjected to gasket sealing tests which were electro-mechanical air leakage tests conducted according to the specifics set forth in pages 1-3 of the SAE (Society of Automotive Engineers, Inc.) technical paper No. 83022 (ISSN 0148-7191 (83/0228-0220, 1983).

The results of the tests were:

| Initial Flange Pressure (psi) | Leakage Rate (psi/min) |
|---|---|
| 570 | 1.389 |
| 915 | 1.587 |
| 2500 | 0.529 |

EXAMPLE 3

This example illustrates a method of producing films of the present invention wherein the cationic exchange is made in situ.

A 10% solids lithium fluorhectorite dispersion was prepared according to procedures taught in U.S. Pat. N. 4,239,519. A film was made of this material by using a 4.5 mil Bird applicator, which was 5 inches wide, to draw down a 4½ mil thick wet film of the dispersion on a glass plate. The glass plate, with the film attached, was then immersed in a 0.25M solution of 1,6 hexanediamine dihydochloride solution to cause a cation exchange between the 1,6 hexanediammonium cations and the fluorhectorite's interlayer cations. A skin was formed, seemingly instantaneously, on the film which indicated such an exchange was taking place. In 10 minutes the film was removed from the plate, washed in deionized water to remove residual salts, and dried. The film had good flexibility and strength retention when wet.

EXAMPLES 4–15

For each of these examples, the procedure of Example 3 was substantially repeated with the exchange cation (all made from the corresponding diamine) as specified to form the corresponding film.

| Example | Exchange Cation |
|---|---|
| 4 | N,N,N',N'—tetramethylethylenediammonium |
| 5 | o-phenylenediammonium |
| 6 | 1,2-propanediammonium |
| 7 | 1,8-octanediammonium |
| 8 | 2,5-tolylenediammonium |
| 9 | 1,7-heptanediammonium |
| 10 | 1,9-nonanediammonium |
| 11 | 1,5-pentanediammonium |
| 12 | 1,2-ethylenediammonium |
| 13 | 1,3-propanediammonium |
| 14 | 1,4-butanediammonium |
| 15 | 1,12-dodecanediammonium |

COMPARATIVE EXAMPLES 1–3

These comparative examples illustrate fluorhectorite films that are made with various prior art exchange cations. Four and one half mil thick films of potassium fluorhectorite (KFH) and ammonium fluorhectorite (NH4FH) were separately prepared. A film was then cast of both the KFH and a NH4FH slurry. A Kymene (a trademark of Hercules, Inc. for a cationic, polyamideepichlorohydrin resin) fluorhectorite film was also prepared by the procedure of Example 2, except that (1) a 3.0% Kymene solution was used and (2) the lithium fluorhectorite film had to be immersed in the Kymene solution for 2 hours until the resultant exchanged film was sufficiently self-supporting to be removed from the glass plate. These films, along with the films made in Examples 3–15, were then subjected to tensile strength and puncture resistance tests which were conducted as follows:

Tensile Strength Measurements

Dry tensile strength measurements were determined using an Instron at 1½" jaw separation and 0.2"/min. crosshead speed. Wet strength measurements were made by bringing water-saturated sponges in contact with both sides of the film sample for 10 seconds while the sample was positioned in the Instron clamps just before the strength test was conducted.

Puncture Resistance Measurements

A sample of film was secured in a retaining device which held the film securely. A stylus which could be loaded was impinged on the film in the direction normal to the surface of the film and loaded with increasing weight until the stylus penetrated the film. In the wet test, the film in the retaining device was submerged in deionized water for 10 seconds immediately before the puncture resistance test.

The data from these tests is shown in the table below.

TABLE

| Film of Example # | Exchange Cation | Tensile Strength (psi) | | Puncture Resistance (gr/mm) | |
|---|---|---|---|---|---|
| | | Dry | Wet | Dry | Wet |
| 3 | 1,6-hexanediammonium | 16000 | 17000 | 13000 | 6000 |
| 4 | N,N,N',N'—tetramethyl-ethylenediammonium | 18000 | 16000 | 11000 | 5100 |
| 5 | o-phenylenediammonium | 13000 | 15000 | 7600 | 3000 |
| 6 | 1,2-propanediammonium | 13000 | 11000 | 14000 | 4200 |
| 7 | 1,8-octanediammonium | 12000 | 11000 | 6500 | 1700 |
| 8 | 2,5-tolylenediammonium | 9800 | 11000 | 6500 | 1800 |
| 9 | 1,7-heptanediammonium | 7300 | 8800 | 16000 | 7500 |
| 10 | 1,9-nonanediammonium | 7000 | 5000 | 3600 | 1400 |
| 11 | 1,5-pentanediammonium | 6600 | 44000 | 5700 | 5200 |
| 12 | 1,2-ethylenediammonium | 5200 | 3600 | 1200 | 600 |
| 13 | 1,3-propanediammonium | 3300 | 1400 | 3500 | 680 |
| 14 | 1,4-butanediammonium | 3000 | 1400 | 6600 | 900 |
| 15 | 1,12-dodecanediammonium | 1800 | 2900 | 3100 | 570 |
| Comparative Example # | | | | | |
| 1 | Kymene (protonated) | 7,000 | 2,700 | 900 | 260 |
| 2 | Ammonium | 3,300 | 1,400 | 3,500 | 680 |
| 3 | Potassium | 1,100 | 200 | 3,300 | 440 |

The data indicates that the films made according to the procedures of the present invention have markedly superior wet tensile strength and/or superior wet puncture resistance when compared to prior art compositions.

Fire and Smoke Resistance Data

A film prepared according to Example 3 was, after being dried, subject to fire and smoke resistant tests in accordance to the procedures specified in ASTM-E-662-79. Three separate tests were made and the results are set forth below.

Test 1—Flamability (The numerical values correspond to the maximum specified optical density as per N.B.S. Technical Note #708.)

Flaming Mode: 0
Smoldering Mode: 0

Test 2

Oxygen Index Type C ASTM D2863-77

Critical Oxygen Index—100% O₂

Test 3

| Radiant Panel ASTM-E162-79 | |
| --- | --- |
| Flame Spread Factor | 1.00 |
| Heat Evolution | 0.0 |
| Flame Spread Index | 0.0 |

Electrical Properties

A film of Example 3 was, when dried, tested for dielectric constant and dissipation factors using the procedures of ASTM D150 and for dielectric strength using the procedures of ASTM D149. The results, set forth below, indicate the film has utility in a variety of electrical insulating properties.

| | Dielectric Constant | Dissipation Factor |
| --- | --- | --- |
| 100 HZ at 25° C. | 26.53 | .2888 |
| 100 HZ at 300° C. | 37.9 | .37 |
| 100 HZ return to 25° C. | 10.7 | .049 |
| 100 KHZ at 25° C. | 12.19 | .153 |
| 100 KHZ at 300° C. | 15.0 | .202 |
| 100 KHZ return to 25° C. | 9.52 | .024 |
| Dielectric strength was 577 v/mil. | | |

COMPARATIVE EXAMPLES 4 AND 5

These examples illustrate using, as a starting material, silicate materials which fall outside the scope of the preferred embodiments of the present invention (directed to mica and vermiculite) in their charge per structural unit and their physical measurements.

For comparative Example 4, a 10% aqueous dispersion was made from a natural hectorite obtained from the source clay minerals depository of the Clay Minerals Society, Bloomington, Ind. For Comparative Example 5, a 10% aqueous dispersion utilizing sodium montmorillonite, which was obtained from the same source. In each example, a film was drawn down using the procedures set forth in Example 2. The glass plates were then immersed for 10 minutes in a 0.25M 1,6-hexanediammonium solution. In both instances, a coherent film was not produced, showing both a lack of desired properties, and an inferior floc.

EXAMPLE 16

This example illustrate a method of preparing a film of the present invention utilizing a vermiculite starting material:

A 10% solids suspension of n-butylammonium vermiculite, which was prepared according to the procedures specified in U.S. Pat. No. 3,325,340, was cast as a film on a glass plate. The film was then tested for its wet and dry tensile strength as described for comparison Examples 1–3 and Examples 3–15. The dry tensile strength was 3796 psi and the wet tensile strength is 1327 psi.

EXAMPLE 17

This example illustrate preparing fibers utilizing the method of the invention. A 15% solids suspension of lithium fluorhectorite (prepared as above) was extruded through an 11 mil opening needle into a 2N solution of 1,6-hexanediamine 2HCL. The extruded fiber was carried by a porous belt and delivered to a second bath of 2N 1,6-hexanediamine 2HCL. The fiber so produced was washed via submersion in deionized water and dried. The resultant fiber was strong and flexible.

EXAMPLE 18

This example illustrates the addition of an epoxy to sheet silicate composites.

Co-dispersions of the diglycidyl ether of bisphenol A (DGBA) and lithium fluorhectorite (LiFH) were prepared by adding the epoxy to a 10% (solids) aqueous lithium fluorhectorite dispersion. The co-dispersion was then mixed via a high shear process. The co-dispersions were formed in the following ratios of LiFH to DGBA:

1. 100 gr. 10% solids LiFH dispersion (10 gr. LiFH solids) 0.1 gr. epoxy (approx. 1% on solids basis).
2. 100 gr. 10% solids LiFH dispersion 1.1 gr. epoxy (approx. 10%).
3. 100 gr. 10% solids 2.5 gr. epoxy (approx. 25%).

The films were prepared by producing 4.5 mil wet films on glass plates with a Bird applicator and immersing the film in a 0.25M hexanediamine 2HCL solution at a pH of 7.0. The resultant films had good wet strength characteristics of hexamethylene diammonium exchanged fluorhectorite. The resultant film was washed with deionized water to remove excess hexamethylene diamine 2HCL and dried at 60° C. The dry films which were flexible were heated to 150° C. for 3 hours. The resultant films exhibited increased rigidity as would be expected with epoxy curing.

For an alternative method of making the articles, epoxy/fluorhectorite co-dispersion as described above were converted to floc form through the addition of the co-dispersion to a 0.25 M 1,6-hexanediamine 2HCL solution with agitation. After washing the excess 1,6-hexanediamine 2HCL from the floc, the floc solids content was adjusted to 2% and subjected to high shear mixing to reduce the particle size. The resultant material was transferred to a nonporous mold and allowed to dry to coherent flexible films of approximately 10 mils thickness.

The films were hot pressed at 150° C. for 3 hours and the films become more rigid.

From 1 to 80 weight parts of epoxy resins can be utilized in producing articles according to the present invention, based on the solids weight of the sheet silicate starting material.

EXAMPLE 19

This example illustrates the differences in elongation and electrical properties one can achieve by varying the diammonium ion used in the instant exchange process. For these experiments, films were prepared utilizing vermiculite dispersions. A film was made by using a 10 mil Bird applicator which was 5 inches wide to draw down a film on a glass plate. The glass plate with the film attached was then immersed in a 0.25M solution of the 1,4-butanediamine dihydrochloride solution at 55° C. to cause a cation exchange between the 1,4-butanediammonium cations and the vermiculite interstitial cations. A skin was formed, seemingly instantaneously, in the film which indicated such an exchange was taking place. The film was allowed to set in the solution an additional 4 hours to ensure the exchange. The film was then removed from the plate, washed in deionized water to remove residual salts and dried. This film had extremely high elongation.

EXAMPLES 20-27

For each of these examples, the procedure of Example 19 was repeated with the exchange cation (all made from the corresponding diamine) as specified to form the corresponding film. The tensile strength and elongation properties are given in Table I while the electrical properties are shown in Table II.

TABLE I

| Film of Example # | Exchange Cation | Tensile (psi) | | % Elongation | |
|---|---|---|---|---|---|
| | | Dry | Wet | Dry | Wet |
| 20 | 1,2-ethanediammonium | 5,100 | 3,000 | 2 | 1.2 |
| 21 | 1,3-propanediammonium | 7,333 | 7,065 | 1.8 | 1.6 |
| 19 | 1,4-butanediammonium | 4,500 | 4,200 | 3.5 | 2.8 |
| 22 | 1,5-pentanediammonium | 10,414 | 8,630 | 3.0 | 2.2 |
| 23 | 1,6-hexanediammonium | 10,600 | 8,806 | 1.4 | .8 |
| 24 | 1,7-heptanediammonium | 13,605 | 8,838 | 0.9 | 0.7 |
| 25 | 1,8-octanediammonium | 11,200 | 10,600 | 0.6 | 0.6 |
| 26 | 1,9-nonanediammonium | 10,394 | 10,251 | 0.7 | 0.6 |
| 27 | 1,10-decanediammonium | 6,553 | 6,040 | 1.0 | 0.8 |

In general, the diammonium exchanged vermiculite shown in table I exhibits good tensile strength both wet and dry. The high elongation properties of the films of Examples 19–22 are truly unique and unexpectedly higher than Examples 23–27. The high elongation properties of these films in Examples 19–23 may allow these materials to be used in applications where the layered silicate material must be used for wrapping.

TABLE II

| Film of Example # | Exchange Cation | Dielectric Constant (50% RH) | | Dissipation Factor (50% RH) | |
|---|---|---|---|---|---|
| | | 100 Hz | 1 MegaHz | 100 Hz | 1 MegaHz |
| 20 | 1,2-ethanediammonium | 500 | 10 | 1.2 | 0.25 |
| 21 | 1,3-propanediammonium | 250 | 8.0 | 0.80 | 0.20 |
| 19 | 1,4-butanediammonium | 140 | 8.3 | 0.63 | .24 |
| 22 | 1,5-pentanediammonium | 100 | 8.0 | 0.90 | 0.20 |
| 23 | 1,6-hexanediammonium | 100 | 8.0 | 1.1 | .15 |
| 24 | 1,7-heptanediammonium | 63 | 8.0 | 0.90 | 0.18 |
| 25 | 1,8-octanediammonium | 20 | 8.0 | 0.54 | 0.09 |
| 26 | 1,9-nonanediammonium | 18 | 9.0 | 0.33 | 0.10 |
| 27 | 1,10-decanediammonium | 19 | 8.5 | 0.36 | 0.12 |

As shown in Table II, the exchange ion used in making the films has a unexpected effect in the dielectric properties of layered silicate based films. In general, as one increases, the carbon length between ammonium groups one sees an improvement in the dielectric properties of the films. In general, Examples, 25, 26 and 27 are unique in that their is not a real variation in dielectric oconstant and dissipation factor as one goes from 100 Hz to 1 Mega Hz. This is a highly desirable trait for materials used for electrical application. The dielectric constant and dissipation factor were obtained following the general guidelines in ASTM D150 under three terminal guarded electrode procedures with the following exceptions: (1) the samples were of necessity thinner than recommeded; (2) the three terminal arrangement was converted to five terminal to accommodate the requirements of the Hewlett Packard 4192A Low Frequency Network Analyzer used to measure capacitance and conductance between 10 Hz and 10 MHz. The electrodes used were either vacuum deposited gold or painted silver (Electrodag 504, manufactured by Acheson, Port Huron, Mich. The low electrode was 1.25 inches in diameter and the sample thickness was approximately 1 mil. Standardization was done by determining the dielectric permitivity of Teflon ® sheets of similar thickness with the same types of electrodes. The Teflon ® values obtained agreed with literature values to 2%.

EXAMPLE 28

The Preparation of an Epoxy/Silicate Composite Containing a Curing Agent

For this example, the epoxy used was: (CMD W60-5520) a non-ionic dispersion of a urethane modified bisphenol A epoxy resin having an epoxide equivalent weight of 540 and solids content of 60%.

An aqueous solution of an epoxy curing agent was prepared as follows:

117.6 g of deionized water was heated to 50° C. on a magnetic stirring hotplate. 31.5 g of Dicyandiamide (Dicy) was slowly added. The temperature was raised to 65°-70° C. at which point the Dicy was completely dissolved. Then 0.9 g of 2-Methylimidazole (2-MI) was added to this hot solution (2-MI used as cure accelerator).

A catalysed, epoxy dispersion was then prepared by adding 10 g of the above hot curing agent solution to 150 g of aqueous, urethane modified epoxy (CMD W60-5520). An additional 3.6 g of deionized (DI) water was added to the dispersion.

The co-dispersion of epoxy and vermiculite, also including the curing agent, was prepared as follows: 17.04 g of the above epoxy dispersion was added to 300 g of a 12% solids vermiculte dispersion in deionized water. This mixture was homogenized at low speed for 15 min. after which it was allowed to stand overnight for removal of entrapped air.

Separate films were drawn down on clean, glass plates using a Bird blade applicator with opening adjusted to give a wet film thickness of 10 mils. The plates were inverted (film side down) into a 0.5N (0.25M) solution of 1,6-hexanediamined dihydrocholoride at a pH of 7 and maintained at a temperature of 55° C. The films were then washed in deionized water until essentially chloride free (silver nitrate test). Drying for one film was carried out at ambient temperature (20° C.) and another at elevated temperature (55° C.) which quite unexpectedly yielded entirely different results:

(A) The ambient drying produced an opaque film; 2—2½ mils thick.
(B) The 55° C. drying produced a semi-transparent film 1—1½ mils thick. SEM cross-sections also reveal surprising differences with the ambient dried samples showing a light scattering platelet structure and the oven dried samples a compressed, laminar structure. There is also some indication that the electrical properties are improved with the elevated temperature drying process.

EXAMPLE 29

Samples of epoxy/silicate films were prepared using two different epoxies, generally following the mixing procedure described. The following epoxy and vermiculite co-dispersions were prepared:

| Materials for Samples A-D | Amount of Ingredients for Samples A-D | | | |
|---|---|---|---|---|
| | A | B | C | D |
| Vermiculite (See note 1) (12% solids) | 3000 g | 3550 g | 1500 g | 1500 g |
| CMD W60-5520 Epoxy | 150 g | 175 g | — | — |
| CMD W55-5003 (See note 3) Epoxy | — | — | 81.8 g | 81.5 g |
| Acrylic Emulsion (See note 2) | 88.5 g | — | — | — |
| Dicyandiamide | — | — | — | 3.15 g |
| 2-methylimidazole | — | — | — | 0.09 g |

(1) Vermiculite dispersion having an average particle size of 25 microns.

(2) Acrylic emulsion (UCAR 123) obtained from Union Carbide Corp. and having a particle size of 0.5 microns and a solids content of 60% added as a modifier to toughen the film.

(3) CMD W55-5003—A non-ionic dispersion of a polyfunctional aromatic epoxy resin with an average functionality of three and a solids content of 57%.

Films of the above formulations were prepared using a 0.4 Normal solution of 1,6-hexanediamine dihydrochloride. The films were washed with deionized water and then dried at 55° C.

Multiple layers of the films have been hot pressed into laminates ranging in thickness from 4 to as much as 200 mils. Prior to lamination, it is generally preferred to pre-bake the films to remove traces of water and other volatiles. A 3 hour cycle at 150° C. in a convection oven has produced good results.

Various tests have been conducted with the results summarized below:

| Test (For Units) | Method | Sampes & Results | | | |
|---|---|---|---|---|---|
| | | A | B | C | D |
| X-Axis CTE (See note 4) | ASTM D646 | 10.6 | 11.7 | — | — |
| Y-Axis CTE (See note 4) | ASTM D646 | 11.4 | 11.0 | — | — |
| Z-Axis (See note 4) | ASTM D646 | 171 | 60-80 | — | — |
| Tg (5) | IPC 2.4 .24 | — | — | 59.6 | 123.2 |
| Flexural Strength (See note 6) | ASTM D790 | 24,500 | 31,000 | — | — |
| Flexural Strength (AMD) | | 20,500 | 23,000 | — | — |
| Flexural Modulus (See note 7) | | 4.4 | 6.90 | — | — |
| Flexural Modulus (AMD) | | 3.05 | 4.50 | — | — |

Note (4) Coefficient of Thermal Expansion; Units are in PPM/°C.
Note (5) Glass Transition Temperature (TMA Method); Units are °C.
Note (6) Conditions are: 1.5 inch span and crosshead speed of 0.02 inch/minutes; Units are PSI.
Note (7) Conditions same as (6); Units are million pounds per square inch (MSI).

As can be seen from the data for samples C and D, the presence of a curing agent greatly affects the glass transition temperature. While the curing agent can be incorporated into the silicate/resin dispersion as shown by sample D, in many cases it is preferably to apply the curing agent by a topical application. This is particularly the case where the films are given a high temperature pre-bake prior to lamination. Curing will take place as the films are subjected to the heat.

High values of samples A and B for flexural modulus is noteworthy. This indicates that the structures are very rigid and coplanar (flat) ideal characteristics for uses such as printed wiring boards.

EXAMPLE 30

The following solutions were prepared:

| Sample # | Curing Agent Composition |
|---|---|
| E | 6.2% DDS - See note 8 - .3% BF$_3$MEA cure accelerator - Note 9 93.5% solvent - Note 10 |
| F | 12% DDS (Note 8); 0.6% BF$_3$MEA - Note 9; 87.4% solvent |
| G | 1.6% dicyandiamide; 0.8% 2-methylimidazole; 97.6% solvent (Note 10) |
| H | 1.2% BF$_3$MEA (Note 8); 98.8% solvent (Note 10) |
| I | NONE |

Note (8) Diamino Diphenyl Sulfone (DDS) (Hardener HT 976 from Ciba-Geigy).
Note (9) Boron Trifluoride Monoethylamine (MEA) complex from Harshaw Chemical.
Note (10) acetone:methylisobutyl ketone (50:50) was the solvent for the curing agent.

Film of Composition A in the previous example was used in this experiment. Samples of the film (4½×4½) were immersed in the above solutions to give a wet pickup of 50%. After air drying to remove the solvent, the treated films were conditioned for 8 hours in vacuum oven at 100° C. Thick laminates (58 mils) were prepared by hot pressing 32 plies of film together. The glass transition temperature was determined by two methods (TMA and DSC) and the results are given in the following table:

| Curing Agent | Tg (°C.) by TMA | Tg (°C.) by DSC |
|---|---|---|
| E | 96 | 104 |
| F | 88 | 101 |
| G | 82 | 107.5 |
| H | 75 | 78.2 |
| I (None) | 68 | 74.5 |

As can clearly be seen all of the curing agents have increased the Tg thus demonstrating the efficacy of a topical application method.

EXAMPLE 31

Example of silicate/epoxy film composite with topical application of a resin adhesive.

A dispersion of Lithium Taeniolite (LiTn) (See note 1) and the water dispersible epoxy of Example 28 was prepared in the following manner:

LiTn powder was sieved through a 75 micron screen and the average particle size was found to be 22 microns. Then 36 g of this powder was dispersed in 264 g of water using a homogenizer. To this dispersion 13.8 g of the epoxy dispersion was added while mixing. After moderate mixing, the dispersion was allowed to stand for a period of time to allow entrapped air to escape.

Then, using a Bird blade as previously described, films of this dispersion were prepared and a flocculating cation exchange bath consisting of 0.2N melamine hydrochloride (Ph of 3.5) at a temperature of 55°–60° C. was used. The final dried film contained 15% by weight of the epoxy resin and had an X-Y axis CTE value of 6 PPM/° C.

A sample of the above film was dip coated with the above epoxy resin dispersion to a wet pickup of 21% resulting in a total epoxy resin content of 28%–15% internally applied and 13% externally applied. After air drying and prebaking, 8 plies of the coated film were hot pressed to produce a laminate 21 mils thick and having an X-Y coefficient of thermal expension (CTE) of 14 PPM/° C. A similar laminate prepared with 25% internal resin binder and having no external resin coating had a CTE value of 7.5 PPM/° C. (a desireably low value).

1. A synthetic fluoromica from Topy (Japan)

This shows that in order to lower the thermal expansion, it is advantageous to include the resin in the composition, thus avoiding topical application. Thermal expansion values for these compositions having the internal resin binder is desireably lower than the composition using the external resin binder.

EXAMPLE 32

This example is offered to contrast ornithine with the instant diammonium compounds (having no acid moiety).

A glass mat was saturated with a 10% solids lithium fluorhectorite dispersion using a 4.5 mil Bird blade. The coated glass mat was then immersed in a 0.25M solution of ornithine hydrogen chloride solution at 60° C. for one hour. The coated mat was then removed from this solution and placed in deionized water and was washed in order to remove the excess salt. During this washing process, the ornithine exchanged fluorhectorite was washed off the glass mat, leaving the mat uncoated and nearly bare.

It should be noted that the ornithine flocculate the silicate dispersion, but contact with water dispersed and washed away the ornithine-exchanged silicate. The instant diammonium cations, however, can produce a washable silicate floc even at a concentration as low as a 0.01 Molar solution.

EXAMPLE 33

Layered silicate films were prepared from both vermiculite (VERM) dispersion (Grace GP 923) and lithium fluorhectorite (Mica-herein indicated as FH- obtained from Corning). A wet film was drawn down in a glass plate using a Bird blade with a 20 mil opening. The wet films (approximately 10 mils thick) were exchanged by immersing them in two aqueous diammonium baths of the following compositions:

0.25N 1,4-butanediammonium dihydrochloride (BDA)

0.25N 1,9-nonanediammoniumhydrochloride (NDA)

Both vermiculite and mica were flocculated using each type of cation. Following a sufficient exposure period in the diammonium salt solutions to insure complete exchange, the wet films were scrupulously washed in deionized water to remove all traces of chloride ion. The silver nitrate test was used to check removal of the chloride. One set of vermiculite and mica (BDA and NDA) exchanged films were extracted with acetone in order to insure a complete removal of residual nonexchanged diamine from at least one set of these films. Extraction was accomplished by immersing this set of wet films in an acetone bath for 16 hours. Over this 16 hour period, the acetone was replaced with fresh acetone four times.

All of the films were then dried by prebaking them at 150° C. for three hours.

Preparation of Epoxy Coating for the Films

Two epoxy resin varnishes designed DDS and DICY (as indicated below) were prepared according to the following formulations:

| DDS Formulation | | |
|---|---|---|
| Ingredient | Grams | Weight Percent |
| (DDS)[1] | 40.5 | 4.72 |
| (BF3MEA)[2] | 2.1 | 0.24 |
| (DER 566 A-80)[3] | 375 | 35.0 (Solids) |
| Acetone (in addition to 20% by weight with acetone in the resin.) | 439.5 | 51.28 |

| DICY Formulation | | |
|---|---|---|
| Ingredient | Grams | Weight Percent |
| (DICY)[4] | 13.5 | 1.58 |
| (2-MI)[5] | 0.6 | 0.07 |
| DER 566 A-80 | 375 | 35.0 (Solids) |
| Acetone (in addition to 20% by weight in resin.) | 468 | 53.48 |

Footnotes from Formulation Charts:
[1]4,4-diaminodiphenyl sulfone obtained from Ciba-Geigy; a curing agent.
[2]Boron trifluoride monoethylamine complex obtained from Harshaw/Filtrol; a cure accelerator.
[3]Brominated bisphenol A based epoxy resin obtained from Dow Chemical (80% solids with 20% by weight acetone).
[4]Dicyandiamide obtained from Cyanamid; a curing agent.
[5]2-methylimidazole obtained from Aldrich Chemical; a cure accelerator.

The above varnish formulations (with both the DDS and the DICY) were diluted with acetone to produce a 17.5% solids solution. These solutions of epoxy, curing agent, and accelerator were used to impregnate the dried films with the resins described above.

Resin Impregnation and B-Staging Conditions

The pre-baked films of flocced silicate were cooled and then resin impregnated by immersing them in the diluted epoxy varnishes which are described above. After removal from the resin solution, the films were air dried for 30 minutes prior to B-staging.

B-staging is a step which is usually performed before a press cure step. The purpose of B-staging is to begin the curing of the epoxy. It might be noted that "curing" of an epoxy involves the transition of the epoxy from the liquid to the solid state. B-staging takes the epoxy to a non-tacky glassy state.

Curing of the epoxy not only brings the epoxy further toward a solid state from the liquid, but also continues with a crosslinking reaction as the "curing" continues. As this continues, the epoxy proceeds from a thermoplastic condition to a thermoset state. Thus, as an epoxy is cured, it becomes continually more solid and more thermoset. Curing also increases the Tg (glass transition temperature), which continually increases as curing proceeds.

Normally it is desired to cure the epoxy as much as possible. Thus, many curing stages, steps and procedures can be and are implemented in order to drive the curing (crosslinking) reaction as far as possible. It might be noted, however, that depending upon the intended application and upon the characteristics desired for the flocculated silicate-epoxy sheet, it might be desired not to cure the epoxy at all or to stop the epoxy curing reaction at lower levels of crosslinking.

B-stage curing was performed by keeping the samples for four minutes at 155° C. in a hot-air convection oven. After this B-staging, the samples were placed in a vacuum oven for 16 hours at 65° C. in order to remove any volatiles present.

Pressing

Pressing is a step which is popularly used when preparing laminates. This step is ideal to increase the bonding between two or more sheets when laminates are prepared. The application of the pressing step to single sheets of either the epoxy flocculated silicate or the flocculated silicate compositions are advantageous when an external application of epoxy, or curing agent, or cure accelerator or mixture of all of these has been performed on the single ply sheet. By subjecting the single ply sheet to pressure under heat as called for in this pressing step, the externally applied materials can be driven further into the sheet material. In addition to this, the presence of the curing agent and especially the cure accelerator together with the epoxy during this pressing step advantageously further cures the material. For this reason, the pressing step is frequently referred to as a press-cure step; and this step can be used last in the curing procedure.

Therefore, after b-staging, these five by five inch samples were stacked with Teflon separator sheets between the samples and pressed in a laboratory press under the following conditions:

1. Load samples in press at ambient temperature and contact pressure.
2. Set temperature control for 180.4° C. (360° F.) and after five minutes increase pressure to 100 psi.
3. After an additional five minutes, the pressure is increased to 200 psi.
4. When the temperature reaches 360° F., the pressure is increased to 300 psi and held there for one hour.
5. The temperature is then increased to 188.65° C. (375° F.) and the pressure to 400 psi.
6. After one hour, the cooling water is turned on and the samples are removed after the temperature has dropped to below 37.4° C. (100° F.).

Glass Transition Temperature Data

After this press cure step, the pressed film samples were then placed in a convection oven at ambient temperatures and over the next hour the temperature was increased to 155° C. The samples were then kept in the oven for 16 hours at this temperature. The samples were then removed from the oven and glass transition temperature (TG) measurements were made on a DuPont Model 910 DSC unit. The data from the measurements are given in the table below:

| Sample Description | TG Measurement Tg; °C. (DDS) | Tg; ° (DICY) |
|---|---|---|
| BDA-VERM | 135.4 | 112.9 |
| " | 152.8 | 104.2 |
| NDA-VERM | 149. | 116.3 |
| " | 152.9 | 114.4 |
| BDA-FH | 141.0 | 115.3 |
| " | 142.25 | 115–120.0 |
| NDA-FH | 152.64 | 127.72 |
| " | 153.57 | 120.90 |

Tg values for the neat resin formulations (i.e. without silicate) are as follows
DDS/Epoxy formulation - 150.8° C.
DICY/Epoxy formulation - 136.7° C.

Electrical Test Results

Two dielectric constant measurements were made. One at ambient conditions and the second after boiling the samples in water for two hours (a preconditioning of film specimens to test the effect of water on the electrical characteristics). Another major purpose of this was to compare the effect of two different ion exchange species and the mica and the vermiculite. In addition to the resin treated samples, baseline measurements were made for the neat vermiculite films which had been exchanged with the BDA and the NDA exchanged flocculated films which had not been resin treated. All of this data is summarized in the following tables:

| Sample Description | 100 Hx | 1 KHz | 10 KHz | 100 KHz | 1 MHz |
|---|---|---|---|---|---|
| Ambient Dielectric Constant Data | | | | | |
| BDA-VERM; no resin | 88.0 | 29.0 | 18.4 | 13.3 | 9.9 |
| NDA-VERM; no resin | 20.9 | 16.0 | 12.2 | 9.9 | 8.9 |
| BDA-VERM; + resin | 61.0 | 30.5 | 15.5 | 11.4 | 9.3 |
| NDA-VERM; + resin | 8.5 | 8.3 | 8.0 | 7.7 | 7.3 |
| Boiling Water Dielectric Constant Data | | | | | |
| BDA-VERM; no resin | 564 | 81.4 | 28.6 | 19.7 | 15.1 |
| NDA-VERM; no resin | 507 | 67.1 | 26.9 | 17.4 | 13.8 |
| BDA-VERM; + resin | 343 | 85.0 | 33.0 | 17.6 | 12.8 |
| NDA-VERM; + resin | 64.5 | 37.6 | 20.8 | 14.9 | 12.4 |

1. DDS/Epoxy resin formulation - 17.5% solids applied externally by topical application instead of the internal epoxy (no internal resin was used).

It might be noted in the above data that the lowered dielectric constant values are the most preferred, furthermore, the lower frequency (100 Hertz—Hz) and boiling conditions are the most severe tests. These tests would indicate problems with water sensitivity more readily than the other frequencies. It is interesting to note that the data clearly shows the advantage of the 1,nonanediammonium cation with regard to the electrical properties as compared to the other cation.

It should also be noted from the above data that the application of an external epoxy coating resin onto a film will help improve the electrical properties. This is especially noted with regard to the water exposure data.

(Abbreviations used are Kilohertz—Khz and Megahertz—Mhz.)

EXAMPLE 34

Multi-ply Board Substrates

While improved electrical performances was obtained with the above nonanediammonium cation, then even more improved electrical performance was noted in this example. It can therefore be concluded that in order to improve or further optimize electrical properties an internal epoxy resin can be added to and mixed in with the flocced silicate preferably by combining the epoxy with the aqueous dispersion followed by flocculation; and then combining this epoxy flocced silicate composition with an externally applied epoxy resin. This embodiment of using an external epoxy resin and an internal epoxy resin with the flocculated silicate gives sheets and boards having superior electrical properties. This example further illustrates this embodiment.

An aqueous dispersion of the following composition was prepared by mixing with a homogenizer for 30 minutes:

- 300 g (Grace GP 923) vermiculite dispersion 12% solids
- 60 g CMD W-60 5520 also used in Example 29 Epoxy dispersion 60% solids On a dry basis, the epoxy comprises 50 weight percent of the composition.

Films were cast from this dispersion and exchanged with 1,9-nonanediammoniium cations. The films were washed, dried and pre-baked as described in Example 33. The films were subsequently impregnated with the DDS/Epoxy resin formulation 17.5% solids also described in Example 33, and were then B-staged as previously disclosed (EX 33). The films prepared were pressed in one, two and six ply samples, and were then post-cured as indicated in Example 33.

Dielectric constant measurements were performed. Industry standard FR-4, an epoxy glass substrate material was used as the comparison. The data collected in the electrical measurements is given in the following tables:

| Ambient Dielectric Constant Data Comparing NDA/Vermiculite/Epoxy Laminates with FR-4 Epoxy/Glass Substrate | | | | | | |
|---|---|---|---|---|---|---|
| Sample | Thickness | Frequency | | | | |
| Description | in Mils | 100 hz | 1 KHz | 10 KHz | 100 KHz | 1 MH |
| NDA-VERM 1 Ply | 2.85 | 4.96 | 4.89 | 4.81 | 4.66 | 4.45 |
| NDA-VERM 2 Ply | 5.5 | 5.20 | 5.13 | 5.04 | 4.91 | 4.73 |
| NDA-VERM 6 Ply | 15.0 | 4.52 | 4.45 | 4.38 | 4.28 | 4.16 |
| FR-4 2 Ply | 7.7 | 5.58 | 5.53 | 5.44 | 5.25 | 5.02 |
| FR-4 18 Ply | 66.5 | 5.09 | 5.03 | 4.95 | 4.81 | 4.63 |
| Boiling Water Dielectric Constant Data Comparing NDA/Vermiculite/Epoxy Laminates with FR-4 Epoxy/Glass | | | | | | |
| Sample | Thickness | Frequency | | | | |
| Description | in Mils | 100 hz | 1 KHz | 10 KHz | 100 KHz | 1 MHz |
| NDA-VERM 1 Ply | 2.85 | 16.6 | 11.8 | 7.88 | 6.12 | 5.12 |
| NDA-VERM 2 Ply | 5.5 | 8.77 | 7.17 | 6.01 | 5.17 | 4.61 |
| NDA-VERM 6 Ply | 15.0 | 5.21 | 4.84 | 4.57 | 4.34 | 4.12 |
| FR-4 2 Ply | 7.7 | 6.52 | 6.37 | 6.22 | 5.96 | 5.63 |
| FR-4 18 Ply | 66.5 | 5.40 | 5.32 | 5.21 | 5.03 | 4.81 |

It should be noted that plying can substantially improve the electrical performance particularly with the boiling water exposure treatment. It is also noteworthy that the combination of using the internal epoxy resin present with the flocculated silicate and adding the external epoxy resin coating produces the best performance comparable to the industry standard substrate material. The ambient dielectric constant data of the first table under this example is especially noteworthy showing desirable low values at low frequency and showing a small change in value proceeding from 100 Hz to 1 MHz.

What is claimed is:

1. A method of preparing a flocculated silicate and epoxy sheet material comprising:
   (1) forming a film from a homogeneous dispersion of epoxy and a swelled 2:1 layered silicate which is selected from the group consisting of: mica and vermiculite, said silicate having exchangeable interstitial ions; and
   (2) contacting the film with a diammonium exchange cation effective to thereby flocculate the silicate by an ion exchange reaction, forming an epoxy and flocculated silicate film.

2. The method as described in claim 1 wherein the diammonium exchange cation is of the formula,

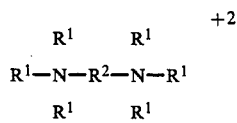

wherein $R^1$ is hydrogen or a $C_1$-$C_8$ saturated or unsaturated straight or branched chain alkyl group; and $R^2$ is a saturated or unsaturated linear or branched hydrocarbon moiety having from 1-18 carbon atoms.

3. A method as described in claim 1 wherein the epoxy and flocculated silicate film was dried and then was coated with a coating composition which included an epoxy, thereby forming an epoxy coated sheet material.

4. A method as described in claim 3 wherein the coating composition included either: (1) a curing agent, or (2) a curing agent and a cure accelerator.

5. A method as described in claim 4 wherein the epoxy coated sheet material was then subjected to epoxy curing.

6. A method as described in claim 3 wherein the epoxy coated sheet material was then laminated to at least one other epoxy coated sheet material.

7. A method as described in claim 1 wherein the homogeneous dispersion of step (1) had a total solids content in an amount of 5% or greater, further providing that the solids were from about 1 to about 75% by weight epoxy.

8. A method as described in claim 1 wherein either (a) a curing agent or (b) a curing agent and a cure accelerator, for the epoxy is added to the homogeneous dispersion of step (1).

9. A method as described in claim 8 wherein, after step (2), the epoxy and flocculated silicate film was dried and hot pressed to at least one other film of epoxy and flocculated silicate so that a multiple layered laminate is formed.

10. A method as described in claim 9 wherein, after the film of epoxy and flocculated silicate is dried, before it is hot-pressed, it is pre-baked to remove traces of volatiles.

11. A method as described in claim 1 wherein, after step (2), the epoxy and flocculated silicate film is dried at a temperature in the range of from about 45° to about 95° C. to form a semitransparent film.

12. A method as described in claim 1 wherein, after step (2), the epoxy and flocculated silicate film is dried and cured simultaneously at a temperature in excess of 120° C.

13. A method as described in claim 12 wherein either (a) a curing agent, or (b) a curing agent and a cure accelerator for the epoxy was added to the homogeneous dispersion of step (1).

14. A method as described in claim 1 wherein, after step (2), the film of epoxy and flocculated silicate was dried at ambient temperatures to produce an opaque film.

15. A method as described in claim 1 wherein, after step (2), the epoxy and flocculated silicate film was dried at a temperature in the range of from about 25° to about 90° C.

16. A method as described in claim 1 wherein, after step (2), the epoxy and flocculated silicate film was dried, and after drying was given a topical application of (a) a curing agent; or (b) a curing agent and a cure accelerator; or (c) an epoxy resin and a curing agent, or (d) an epoxy resin, a curing agent, and a cure accelerator.

17. A method as described in claim 16 wherein after drying but before the topical application the film was pre-baked to remove volatiles.

18. A method as described in claim 16 wherein, after the topical application the epoxy and flocculated silicate film was hot-pressed to at least one more film of epoxy and flocculated silicate to from a multiple layer laminate.

19. A method as described in claim 18 wherein, after the topical application, the film was either (a) dried, or (b) dried and then pre-baked before it was hot-pressed.

20. A method as described in claim 1 wherein a multiple layered laminate is then formed by drying and pre-baking the epoxy and flocculated silicate film, and then hot pressing the film to at least one more epoxy and flocculated silicate film to form a multiple layer laminate.

21. A method as described in claim 1 wherein the epoxy and flocculated silicate film is then dried and then cured; further providing that during curing the film is press cured.

22. A method as described in claim 1 wherein a modifier is added to the homogeneous dispersion of step (1) in order to toughen the epoxy and flocculated silicate film.

* * * * *